(12) United States Patent
Miller et al.

(10) Patent No.: US 8,780,558 B2
(45) Date of Patent: Jul. 15, 2014

(54) POROUS THERMOPLASTIC FOAMS AS HEAT TRANSFER MATERIALS

(75) Inventors: Dustin M. Miller, Seattle, WA (US); Wei Li, Austin, TX (US)

(73) Assignee: University of Washington through its Center for Commercialization, Seattle, WA (US)

( * ) Notice: Subject to any disclaimer, the term of this patent is extended or adjusted under 35 U.S.C. 154(b) by 38 days.

(21) Appl. No.: 13/394,000

(22) PCT Filed: Sep. 2, 2010

(86) PCT No.: PCT/US2010/047710
§ 371 (c)(1),
(2), (4) Date: Apr. 19, 2012

(87) PCT Pub. No.: WO2011/028924
PCT Pub. Date: Mar. 10, 2011

(65) Prior Publication Data
US 2012/0195004 A1    Aug. 2, 2012

Related U.S. Application Data

(60) Provisional application No. 61/239,157, filed on Sep. 2, 2009.

(51) Int. Cl.
*H05K 7/20* (2006.01)
*H01L 23/373* (2006.01)

(52) U.S. Cl.
CPC ........ *H05K 7/20218* (2013.01); *H05K 7/20236* (2013.01); *H05K 7/20763* (2013.01); *H01L 23/3733* (2013.01)

USPC .......................................................... 361/699

(58) Field of Classification Search
CPC ............ H01L 23/3733; H01L 23/3747; H01L 23/473; H05K 7/20218; H05K 7/70236; H05K 7/20763
USPC .......................................................... 361/705
See application file for complete search history.

(56) References Cited

U.S. PATENT DOCUMENTS

| | | | | |
|---|---|---|---|---|
| 4,888,663 A * | 12/1989 | Longerich et al. | ............ | 361/699 |
| 4,922,381 A * | 5/1990 | Longerich et al. | ............ | 361/792 |
| 5,198,889 A * | 3/1993 | Hisano et al. | ................ | 257/678 |
| 6,018,616 A * | 1/2000 | Schaper | ........................ | 392/418 |
| 6,975,027 B2 * | 12/2005 | Farrar et al. | .................... | 257/712 |
| 7,109,413 B2 * | 9/2006 | Chen | ................................ | 174/50 |
| 7,626,252 B2 * | 12/2009 | Farrar et al. | .................... | 257/686 |
| 7,742,297 B2 * | 6/2010 | Behrens et al. | ............... | 361/690 |
| 8,169,789 B1 * | 5/2012 | Tong | ............................. | 361/760 |
| 8,176,972 B2 * | 5/2012 | Mok | .............................. | 165/46 |
| 2007/0012423 A1 * | 1/2007 | Kinoshita et al. | ............ | 165/80.4 |
| 2007/0247808 A1 * | 10/2007 | Behrens et al. | ............... | 361/690 |
| 2008/0101016 A1 * | 5/2008 | Brooks et al. | ................ | 361/690 |

* cited by examiner

*Primary Examiner* — Gregory Thompson
(74) *Attorney, Agent, or Firm* — McDonnell Boehnen Hulbert & Berghoff LLP

(57) ABSTRACT

Interconnected, open-celled porous or microporous polymeric foams are used for the preparation of heat transfer devices. The use of such porous polymeric foams can generate a turbulent flow within a heat exchanging liquid, thus enabling increased heat transfer to and from the fluid. The present disclosure provides devices having a heat transfer element containing a heat exchange region wherein a heat exchange fluid can be circulated through a porous polymeric foam; and method for making and using such devices.

21 Claims, 5 Drawing Sheets

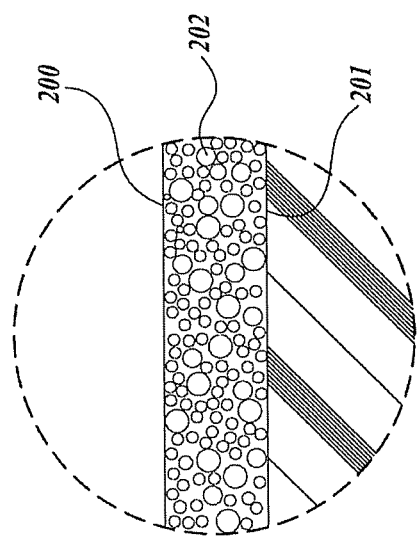
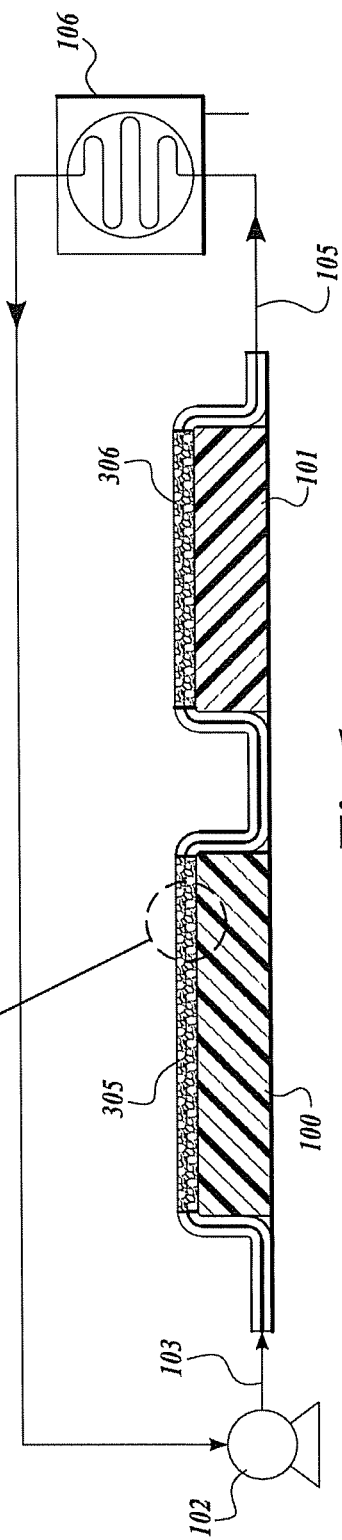
Fig.2.
Fig.1.

US 8,780,558 B2

POROUS THERMOPLASTIC FOAMS AS HEAT TRANSFER MATERIALS

CROSS-REFERENCE TO RELATED APPLICATIONS

This application claims the benefit of the filing date, under 35 U.S.C. §119(e), of U.S. Provisional Application Ser. No. 61/239,157, filed Sep. 2, 2009, which is hereby incorporated by reference in its entirety.

FIELD OF THE INVENTION

The present application is directed to the use of porous or microporous materials in the area of heat transfer, for example, for small scale devices; the devices comprising the porous or microporous materials and methods for using and making the devices.

BACKGROUND OF THE INVENTION

Presently, the main mode of heat transfer is through conduction to a metal surface which then dissipates the heat to the air. Such devices are normally called "heat sinks" Many high tech computers employ the use of cooling fluids that circulate in the metal heat sink to more quickly transfer the heat away from the computer chip. These devices, normally made of metal and thus rigid, must be machined to the surface of the heat source, and many times are required to be flat due to the expense of conforming to a surface.

Interconnected porous polymer structures have been under development for many years. For example, certain porous materials have been developed for microfluidic mixing, where a porous polymer material with an encapsulating skin is created, whereupon fluid inlets and outlets are positioned. See, for example, U.S. Patent Application Publication No. 2008/0094937, incorporated herein expressly by reference. Therein, fluids are introduced into one or more inlets, which then pass into an interconnected porous structure where turbulence is created. By the time the fluid exits the outlet, the fluids are thoroughly mixed.

BRIEF DESCRIPTION OF THE DRAWINGS

FIG. 1 shows a diagrammatical illustration of a system using porous or microporous materials for cooling.

FIG. 2 is a diagrammatical illustration of an enlarged cross-sectional area to show a porous structure 305 of FIG. 1.

SUMMARY OF THE INVENTION

Figure 3:
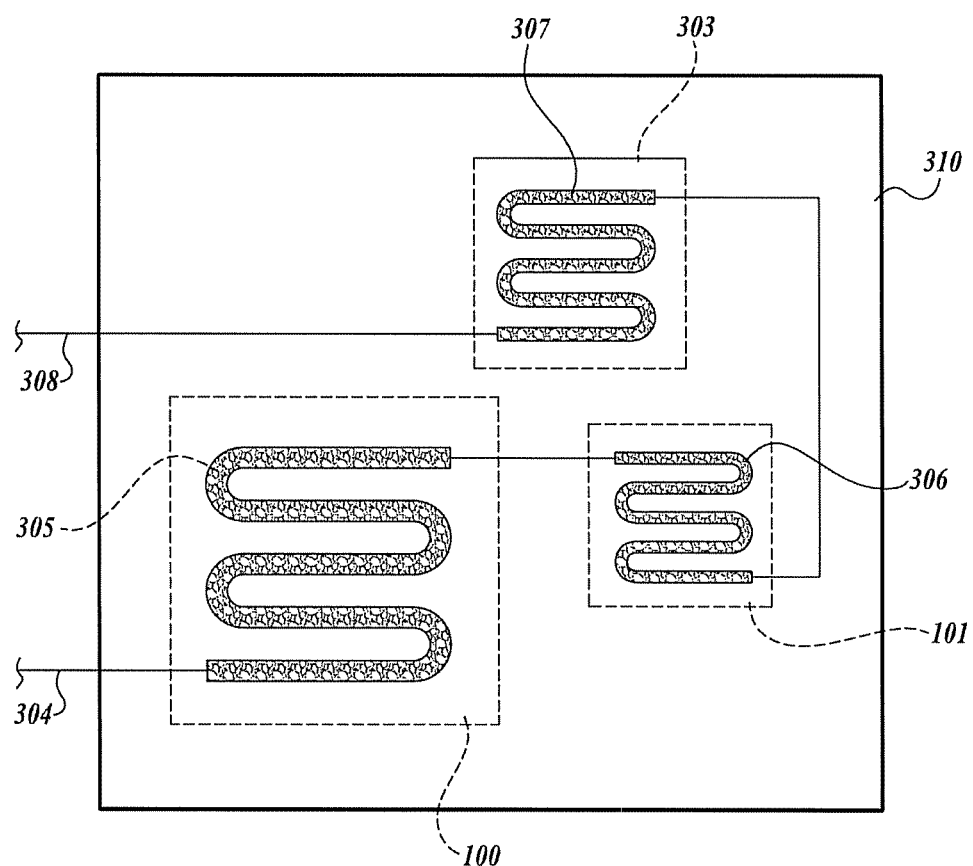
FIG. 3 is a diagrammatical illustration of a top view of an exemplary embodiment of devices needing to be cooled arranged in a serial configuration

In one aspect, the present disclosure provides devices comprising a first element having at least one surface in need of heating or cooling and at least one heat transfer element in thermal communication with each surface in need of heating or cooling, wherein each heat transfer element comprises at least one heat exchange region, each having a distal end and a proximal end, wherein each heat exchange region independently comprises (i) a porous polymeric foam disposed between a contact surface of the heat transfer region and a second surface of the heat transfer region; (ii) one or more inlets at or near the proximal end of the heat exchange region, wherein each inlet is in fluid communication with the porous polymeric foam; and (iii) one or more outlets at or near the distal end of the heat exchange region, wherein each outlet is in fluid communication with the porous polymeric foam, wherein the contact surface of each heat transfer region and the second surface of each heat transfer region each independently comprise an essentially liquid impermeable material; and at least a portion of the contact surface of each heat transfer region is operatively attached to at least one surface in need of heating or cooling. In certain embodiments, the surface is in need of cooling. In other embodiments, the surface is in need of heating.

In another aspect, the present disclosure provides methods for heating or cooling a surface of a device in need of such heating or cooling, comprising providing a device of the preceding aspect and circulating a heat exchange fluid through the heat transfer element via the inlet and the outlet.

In yet another aspect, the present disclosure provides methods for preparing a device of the preceding aspects comprising operatively attaching, to at least one surface of a first element in need of heating or cooling, one or more heat exchange elements as described above.

In another aspect, the present disclosure provides the heat exchange elements as described above.

DETAILED DESCRIPTION OF THE INVENTION

The present disclosure is related to the use of interconnected, open-celled porous or microporous materials as heat transfer devices. Normally, polymer materials are great insulators to heat transfer; but it has been found that on the micro-scale, the limiting factor for such devices is not the material itself, but the heat transfer to the fluid. Advantageously, it has been found that the use of such porous polymeric foams generates a turbulent flow of a heat exchanging liquid, thus enabling increased heat transfer to and from the fluid.

Thereby, the present disclosure provides devices comprising a first element having at least one surface in need of heating or cooling and at least one heat transfer element in thermal communication with each surface in need of heating or cooling, wherein each heat transfer element comprises at least one heat exchange region, each having a distal end and a proximal end, wherein each heat exchange region independently comprises (i) a porous polymeric foam disposed between a contact surface of the heat transfer region and a second surface of the heat transfer region;

At least a portion of the contact surface of each heat transfer region is operatively attached to at least one surface in need of heating or cooling.

The phrase "thermal communication" is as used herein refers to a relationship between two or more components wherein heat can flow between the two or more components. For example, two components can be in thermal communication due to the fact that they are in contact with one another, or due to the fact that they are of sufficiently close proximity that heat can flow from one component to another. In certain embodiments, the two surfaces are in contact with one another.

The phrase "operatively attached" as used herein means that the referenced materials are either in direct contact through bonding methods familiar to those skilled in the art; or indirectly attached through a spacing moiety which does not prevent thermal communication between the surface in need of heating of cooling and the heat transfer element (such as attaching through a thin thermally conductive layer, such as a metal or a thermally conductive adhesive).

One or more inlets are provided at or near the proximal end of the heat exchange region to allow for fluid communication with the porous polymeric foam. Such inlets may be formed through the contact surface, the second surface, or both, at or near the proximal end of the heat exchange region. Alternatively, such inlets can be formed within a plane containing the porous polymeric foam. Further, one or more outlets are provided at or near the distal end of the heat exchange region to allow for fluid communication with the porous polymeric foam. Such outlets may be formed through the contact surface, the second surface, or both, at or near the distal end of the heat exchange region. Alternatively, such outlets can be formed within a plane containing the porous polymeric foam.

The term "near" as used herein means that the referenced item is closer to the referenced end of an object rather than the opposing end. For example, an inlet near the proximal end of a heat exchange region is closer to the proximal end of the region than the distal end of the same region. Similarly, an outlet near the distal end of a heat exchange region is closer to the distal end of the region than the proximal end of the same region.

The phrase "in fluid communication" as used herein refers to a relationship between two components whereby fluid can flow from one component to the other; fluid may flow directly from one unit to another or indirectly when additional components exist between the two components which to not prevent fluid flow between the two components.

The term "foam" as used herein refers to open cellular structures containing pores that are connected to one another and form an interconnected network. Thus, a "porous polymeric foam" refers to an open cellular structure, the cell walls of which comprise a polymeric material. In certain embodiments, the porous polymeric foam comprises pores having an average diameter size of about 10 μm to about 300 μm. In certain embodiments, the porous polymeric foam comprises pores having an average diameter size of about 10 μm to about 200 μm. In other embodiments, the porous polymeric foam comprises pores having an average diameter size of about 80 μm to about 200 μm. In other embodiments, the porous polymeric foam comprises pores having an average diameter size of about 80 μm to about 300 μm.

The phrase "surface in need of cooling" as used herein refers to a surface of an element that, when the element is under its intended mode of operation, generates or receives heat from another portion of the element such that the temperature of the surface increases with respect to its non-operative state. The phrase "surface in need of heating" as used herein refers to a surface of an element that, when the element is under its intended mode of operation, requires the addition of heat to the surface.

The first element can comprise at least two surfaces in need of heating or cooling (such as 2, or 3, or 4, or 5, or 6, or 7, or 8, or 9, or 10). When comprising at least two surfaces, at least a portion of the contact surface of one or more heat transfer regions of a single heat transfer element can be operatively attached to each surface in need of heating or cooling. Alternatively, separate heat transfer elements can be in thermal communication with each surface in need of heating or cooling, wherein at least a portion of the contact surface of one or more heat transfer regions of each heat transfer elements is operatively attached to its respective surface in need of heating or cooling. For example, for a first element comprising two surfaces in need of heating or cooling, separate heat transfer elements can be in thermal communication with each surface.

More than one heat transfer element (i.e., at least two) can be in thermal communication with each surface in need of heating or cooling of the first element. In such embodiments, at least a portion of the contact surface of each heat transfer region of each heat transfer element can be operatively attached the one surface in need of heating or cooling. For example, in a first element having a single surface in need of heating or cooling, more than one heat transfer element (i.e., at least two) can be in thermal communication with the single surface in need of heating or cooling.

The devices herein can also comprise at least a second element having at least one surface in need of heating or cooling. In such embodiments, at least one heat transfer element is in thermal communication with at least one surface in need of heating or cooling of the second element. In one such embodiment, at least a portion of the contact surface of at least one heat transfer region is operatively attached to at least one surface in need of heating or cooling of the second element.

In another embodiment, the second surface of at least one heat transfer region is operatively attached to at least one surface in need of heating or cooling of the second element. For example, a sandwich structure can be formed wherein a heat exchange element is in thermal communication with a surface of the first device in need of heating or cooling and a surface of the second device in need of heating or cooling In any of the preceding embodiments, each heat transfer element can independently comprise one or at least two heat exchange regions. The number of heat transfer regions necessary in each heat exchange element can be determined by one skilled in the art taking into consideration the heating or cooling requirements of the surface itself. In certain embodiments each heat transfer element can independently comprise one heat transfer region. In certain embodiments each heat transfer element can independently comprise two to ten heat transfer regions. In certain embodiments each heat transfer element can independently comprise two to five heat transfer regions. In certain embodiments each heat transfer element can comprise two transfer regions. In certain embodiments each heat transfer element can comprise three transfer regions. In certain embodiments each heat transfer element can comprise four transfer regions. In certain embodiments each heat transfer element can comprise five transfer regions.

When a heat transfer element comprises more than one heat transfer region, the regions can be in fluid communication with one another in a serial or parallel manner, or any combination thereof. For example, in a heat transfer element comprising two heat transfer regions, the two regions can be connected in parallel such that the one or more outlets of the first region are in fluid communication with the inlets of the second region; or they may be connected in parallel such that the inlets and outlets of each respective region are not in direct fluid communication with one another, but may, for example, be in fluid communication with a heat radiator, heat source, and/or fluid pump as described below. In another example, for a heat transfer element comprising four heat transfer regions, two separate pairs of regions can be in fluid communication in serial as described above, and the two separate pairs can be in fluid connection in parallel to a heat radiator, heat source, and/or fluid pump as described below.

Similarly, when a device comprises two or more heat transfer elements, the elements can be connected in a serial or parallel manner, or any combination thereof. For example, in a device comprising two heat transfer elements, the two elements can be connected in parallel such that the one or more outlets of the first element are in fluid communication with the inlets of the second elements; or they may be connected in parallel such that the inlets and outlets of each respective element are not in direct fluid communication with one another, but may, for example, be in fluid communication with a heat radiator, heat source, and/or fluid pump as described below. In another example, for device comprising four heat transfer elements, two separate pairs of elements can be in fluid communication in serial as described above, and the two separate pairs of elements can be in fluid connection in parallel to a heat radiator, heat source, and/or fluid pump as described below.

In other embodiments, wherein the devices comprises two or more heat transfer elements, at least one heat transfer element, in contact with a surface in need of cooling, is in direct fluid communication with another heat transfer element in contact with a surface in need of heating, such that the heat absorbed from the first heat transfer element is transferred to the second element.

In various non-limiting embodiments, the first element and the second element, when present, can independently comprise a microprocessor, circuit board, battery, electronic display screen, solid-state memory, hard drive, light emitting diode, projector bulb, solar panel, aircraft wing, vehicle exhaust system, or human tissue, each having a surface in need of heating or cooling as is familiar to those skilled in the art. In certain embodiments, the first element is a microprocessor. In certain other embodiments, the first element is a circuit board. In certain other embodiments, the first element is a battery. In certain other embodiments, the first element is an electronic display screen. In certain other embodiments, the first element is a solid-state memory. In certain other embodiments, the first element is a hard drive. In certain other embodiments, the first element is a light emitting diode. In certain other embodiments, the first element is a projector bulb. In certain other embodiments, the first element is a solar panel. In certain other embodiments, the first element is an aircraft wing. In certain other embodiments, the first element is a vehicle exhaust system. In certain other embodiments, the first element is a human tissue. In certain other embodiments, the first and second elements are microprocessors.

Each contact surface and each second surface of each heat exchange region can each independently comprise an essentially liquid impermeable material. The term "essentially liquid impermeable" as used herein that a liquid, such as a heat exchanging liquid and/or water, will not pass through the referenced material, under ordinary use conditions, in a direction generally perpendicular to the plane of the layer or laminate at the point of liquid contact. In certain embodiments, an essentially liquid impermeable material has a water vapor permeability of less than about 50 g-mil/100 in$^2$-atm-d as measured at 38° C. and 90% relative humidity as is familiar to those skilled in the art. In certain other embodiments, an essentially liquid impermeable material has a water vapor permeability of less than about 10 g-mil/100 in$^2$-atm-d as measured at 38° C. and 90% relative humidity as is familiar to those skilled in the art. In certain other embodiments, an essentially liquid impermeable material has a water vapor permeability of less than about 1.0 g-mil/100 in$^2$-atm-d as measured at 38° C. and 90% relative humidity as is familiar to those skilled in the art.

In one embodiment, each essentially liquid impermeable material independently can comprise a polymer. In another embodiment, the porous polymeric foam and the essentially liquid impermeable material can each comprise the same polymer. In any of the embodiments wherein the porous polymeric foam and the essentially liquid impermeable material each comprise the same polymer, the heat exchange region can be prepared from a single polymeric substrate wherein the porous region is internally foamed as described in the methods below (e.g., by gas impregnation and ultrasonication methods). Inlets and outlets to the porous region can be formed as described below (e.g., milling and/or drilling).

Examples of suitable polymers include, but are not limited to, a cyclic olefin polymer, polyethylene, polypropylene, polyetherimide, polytetrafluoroethylene, polyetherketoneketone, polymethylmethacrylate, polyvinylidene chloride, a liquid crystal polymer, polychlorotrifluoroethylene, polyethylene terephthalate, poly(ethylene-co-vinyl alcohol), or polyetheretherketone (such as VICTREX™).

The polymers used in the essentially liquid impermeable material and/or porous polymeric foam can be selected to have temperature stabilities suitable for the intended application. For example, when a heat exchange element is placed in contact with a microprocessor, the polymers comprising the essentially liquid impermeable material and/or porous polymeric foam can have a glass transition temperature and/or decomposition temperature greater than the operating temperature of the microprocessor. In certain embodiments, the glass transition temperature and/or decomposition temperature is greater than about 85° C.; or greater than about 90° C.; or greater than about 100° C.; or greater than about 125° C.; or greater than about 150° C.; or greater than about 175° C.; or greater than about 200° C.

In one embodiment, the polymer comprises or consists of cyclic olefin copolymer. In another embodiment, the polymer comprises or consists of polymethylmethacrylate. In another embodiment, the polymer comprises or consists of polyetherimide.

In another embodiment, the porous polymeric foam and the essentially liquid impermeable material each comprise cyclic olefin copolymer, polymethylmethacrylate, or polyetherimide. In another embodiment, the porous polymeric foam and the essentially liquid impermeable material each comprise cyclic olefin copolymer (e.g., TOPAS). In another embodiment, the porous polymeric foam and the essentially liquid impermeable material each comprise polymethylmethacrylate.

In another embodiment, the porous polymeric foam and the essentially liquid impermeable material each comprise polyetherimide. Examples of polyetherimides include, but are not limited to, ULTEM™ (a copolymer between bisphenol-A and a bis(nitrophthalimide) end-capped diamine monomer, such as 1,3-diaminobenzene), DURATRON™, TEMPALUX™)

The term "liquid crystal polymer", as used herein, refers to polymers having liquid crystalline properties themselves and those having such properties when blended with a solvent, second polymer, and/or reinforcing material, such as carbon fibers, glass fibers, or minerals. For convenience, the term "liquid crystal polymer," unless otherwise defined, is used herein to include material of both kinds. In certain embodiments, liquid crystal polymers include aromatic polyesters having the above referenced properties. Examples of the liquid crystal polymer include, but are not limited to, VEC- TRA™ (A950 is a random copolymer polyester of 4-hydroxybenzoic acid and 6-hydroxy-2-naphthoic acid B950 is a random copolymer of 6-hydroxy-2-naphthoic acid, terephthalic acid, and p-aminophenol, each available from Ticona), XYDAR™ (a random copolymer polyester of p-hydroxybenzoic acid, 4,4'-biphenyl, and terephthalic acid and/or isophthalic acid available from Solvay), ZENITE® (a random copolymer of terephthalic acid, p-hydroxybenzoic acid, hydroquinone, and other aromatic diols, aromatic diacids, and aromatic hydroxy carboxylic acids available from DuPont), and VECSTAR™ (an aromatic polyester prepared from acetoxybenzoic acid and acetoxy naphthoic acid available from Kuraray).

The term "cyclic olefin polymer" as used herein refers to polymers prepared by copolymerization of one or more cyclic monomers (e.g., norbornene, tetracyclododecene) with ethene, or by ring-opening metathesis of one or more unsaturated cyclic monomers optionally followed by hydrogenation, including unsaturated, partially unsaturated or saturated cyclic olefin polymers (COP), and an unsaturated, partially unsaturated, or saturated cyclic olefin copolymers (COC). Examples of cyclic olefin polymers include, but are not limited to, APEL™ (copolymer of norbornene and ethylene; Mitsui Chemical), ZEONOR™ and ZEONEX™ (polymers from ring-opening metathesis of norbornene derivatives followed by complete hydrogenation of double bonds; Zeon Chemical), and TOPAS™ (copolymer of ethylene and norbornene, TOPAS Advanced Polymers GmbH).

In order to provide for improved mechanical, thermal, and/or electrical properties to the porous polymeric foam and/or essentially liquid impermeable material, each can independently comprise a composite material, such as a polymer composite. Composite materials at the interfacial surface between the heat exchange device and first element (e.g., electronic device) as well as within the porous structure could help to transfer thermal energy more effectively into the heat exchange fluid. Such composites generally comprise a polymer, as noted above, and thermally conductive particles or fibers. Examples of thermally conductive particles or fibers include, but are not limited to, aluminum, copper, and diamond particles, metal coated inorganic nanoparticles, carbon fibers, carbon nanofibers, carbon nanotubes, carbon powder, graphene nanoplatelets, inherently conductive polymers, inherently dissipative polymers, and mixtures thereof. In one embodiment, the thermally conductive particles or fibers comprise carbon fibers carbon nanofibers, carbon nanotubes, carbon powder, inherently conductive polymers, and mixtures thereof.

In one embodiment, the thermally conductive particles or fibers comprise or consist of aluminum, copper, diamond particles, or mixtures thereof. Such particles can have an average diameter between about 10 nm to about 10 μm. In certain embodiments, the particles can have an average diameter between about 10 nm and about 1000 nm; or about 10 nm and about 500 nm; or about 10 nm and about 250 nm; or about 10 nm and about 100 nm. In other embodiments, the particles can have an average diameter between about 1 μm and about 10 μm; or about 500 nm and about 10 μm; or about 250 nm and about 10 μm; or about 100 nm and about 10 μm.

In another embodiment, the thermally conductive particles or fibers comprise or consist of metal coated inorganic nanoparticles. The term "nanoparticles" as used herein means substantially spherical or irregularly shaped particles with an average diameter of between 1 nm and 1000 nm. The particles can comprise a single chemical element or a single alloy; or can comprise multiple elements or alloys in homogeneous (e.g., metal coated inorganic nanoparticles such as core-shell nanoparticles) or inhomogeneous compositions. In certain embodiments, the nanoparticles have an average diameter of between 1 nm and 500 nm; or 1 nm and 250 nm; or 1 nm and 100 nm; or 1 nm and 50 nm; or 1 nm and 10 nm. The average diameter of the nanoparticles can be determined according to methods familiar to those skilled in the art, for example, by dynamic light scattering.

In another embodiment, the thermally conductive particles or fibers comprise or consist of carbon powder, carbon fibers, or mixtures thereof. The term "carbon powder" as used herein refers to powdered carbon or graphite including but not limited to, flaked graphite; carbon black; pulverized coal, coke or charcoal; and petroleum residues. The term "carbon fibers" as used herein refers to fibers having a carbon content of about 50%-98% by weight, or about 75%-98% by weight, or about 95%-98% by weight. Examples of carbon fibers that can be used include, but are not limited to, those disclosed in U.S. Pat. Nos. 5,518,836; 5,532,083; 5,700,573; 5,763,103; 5,776,607; 5,776,609; 5,821,012; 5,837,626 and 5,858,530, the disclosures of which are all entirely incorporated by reference. Further examples of carbon fibers include those derived from precursor polymers (e.g., as rayon or polyacrylonitrile (PAN)) such as SIGRAFIL C® (SGL Carbon Group), Pyrograf® (Applied Sciences, Inc.), CARBONCONX™ (Xerox), and Delrin 300AS™ and 300AT™ (DuPont).

In another embodiment, the thermally conductive particles or fibers comprise or consist of carbon nanofibers, carbon nanotubes, or mixtures thereof. The term "carbon nanofibers" as used herein refers to tubular carbon materials that are generally, but not always, larger in diameter than carbon nanotubes. In various embodiments, the carbon nanofibers are between about 50 nm and about 300 nm in diameter. In other various embodiments, the carbon nanofibers are between about 100 nm and about 300 nm in diameter. The term "carbon nanotube" as used herein refers to nano-scale tubes made substantially of carbon atoms, having a structure based on graphite basal planes that are wrapped or curled to become a tube. The carbon nanotubes may comprise a variety of lengths, diameters, chiralities (helicities), number of walls, and they may be either open or capped at their ends. Furthermore, they may be chemically functionalized in a variety of manners. These could include semiconducting (bandgaps ~1-2 eV), semi-metallic (bandgaps ~0.001-0.01 eV) or metallic carbon nanotubes (bandgaps ~0 eV), and more particularly mixtures of the three types. Carbon nanotubes can have a diameter of from about 2 Å to over 20 μm. However, in one aspect, the carbon nanotubes may be single walled tubes. In another aspect, the nanotubes may be multiple walled. In another embodiment, the nanotubes are acid-treated nanotubes. The term "acid-treated nanotubes" as used herein means conductive carbon nanotubes, as defined herein, that as a result of treatment with a strong acid, such as but not limited to, sulfuric acid, have surface groups, such as sulfonate and carboxylic acid groups, that can coordinate metal ions and/or nanoparticles.

In another embodiment, the thermally conductive particles or fibers comprise or consist of graphene nanoplatelets. The term "graphene nanoplatelets" as used herein refers to generally irregular shaped particles comprising graphene sheets that may have ether, hydroxyl, and/or carboxyl groups at their peripheries. Aspect ratios for this material can range into the thousands. Each particle consists of several sheets of graphene with an overall thickness ranging from an average of about 1 nm to about 15 nm, depending on grade. Particle diameters can range from less than about 1.0 μm to greater than about 100 μm.

In another embodiment, the thermally conductive particles or fibers comprise or consist of inherently conductive polymers. The term "inherently conductive polymers" as used herein refers to those polymers that have semiconductive or conductive properties as are familiar to one skilled in the art. For example, inherently conductive polymers include, but are not limited to, polyanilines (e.g., emeraldine base), polypyrroles, polythiophenes (e.g., PEDOT (poly(3,4-ethylenedioxy)thiophene), polyphenylenes, polyphenylenevinylenes, polyphenyleneethynylenes, poly(fluorene)s, polypyrenes, polyazulenes, polynaphthalenes, polycarbazoles, polyazepines, polyindoles, polyphenylenesulfides.

In another embodiment, the thermally conductive particles or fibers comprise or consist of inherently dissipative polymers. The term "inherently dissipative polymers" as used herein refers to polymers with inherent conductivity in the dissipative range. Such inherently dissipative polymers can be blended with a second polymer, such as a thermoplastic polyurethane or polyester, or a polyethylene, polypropylene, poly(vinyl chloride), or acrylic. Examples of suitable inherently dissipative polymers include, but are not limited to, STAT-RITE® (Lubrizol) S-1110, S-1120, S-1150, S-1180, S-1117, M-809, M-690, S-680, SB544, SIS535, X-5166, M-809, S-680, M-690, S-250, X-5111, E-1140, E-1150, and X-5091.

When a polymer composite is used for the porous polymeric foam and/or the essentially liquid impermeable material, it may comprise about 1 wt % to about 6 wt % of the thermally conductive particles or fibers, as described above. In certain embodiments, the porous polymeric foam and/or the essentially liquid impermeable material, can comprise about 2 wt % to about 6 wt %; or about 3 wt % to about 6 wt %; about 4 wt % to about 6 wt %; or about 1 wt % to about 5 wt %; or about 1 wt % to about 4 wt %; or about 1 wt % to about 2 wt %, of the thermally conductive particles or fibers.

Such porous materials can be created through a variety of different processing methods, such as by the use of ultrasound/High Intensity Focused Ultrasound (HIFU). For example, a porous polymeric foam having micro cellular pores can be prepared by impregnating a polymeric substrate (comprising a polymer or polymer composite) with gas, followed by applying high intensity focused ultrasound energy onto the gas-impregnated chip. In the gas impregnation step, the polymeric substrate can be placed into a high-pressure vessel filled with an inert gas, such as nitrogen or carbon dioxide. Over time, the gas molecules dissolve into the polymeric substrate so that the substrate becomes gas-impregnated. Depending on the gas pressure and the impregnation time (the time that the substrate remains in the pressure vessel), the final gas concentration in the impregnated polymeric substrate can be controlled. In a subsequent step, the gas-impregnated polymeric substrate is retrieved from the pressure vessel and mounted on a computer controlled XYZ stage for ultrasonic insonation with a high intensity focusing ultrasound transducer so form one or more regions of foam within the polymer substrate. Because of the heating and implosion effects induced by ultrasound waves or energy, the gas-impregnated polymeric substrate becomes thermodynamically unstable and undergoes phase separation to generate a porous polymeric foam microstructure having microcellular pores. After foaming, micro milling and drilling can be used to machine channels and holes to form inlets and outlets for the porous polymeric foam portion. Once the inlets and outlets have been formed, additional adaptor elements can be attached according to methods familiar to those skilled in the art, for example, by adhesive bonding.

Each of these foamed regions will have an interconnected, open-celled porous structure with a thin layer of solid thermoplastic material on their surface (i.e., the contact and second surfaces as described above), forming a skin-core microcellular structure. To create a heat exchanger from these porous materials, cooling fluids can be allowed to pass through the porous interior sections. The skin structure will keep the cooling fluid entrapped and will also be thin in order to transfer heat from the device to be cooled to the cooling fluid.

In another embodiment, the heat exchange regions can comprise a composite structure of the porous polymeric foam with alternative liquid barrier materials. For example, one or more thin layers of a metal on the exterior of the porous polymeric foam could be used as an essentially liquid impermeable material. In one embodiment, the contact layer of the heat exchange region comprises a metal. In another embodiment, the contact layer of the heat exchange region comprises a metal and the second layer of the heat exchange region comprises a polymer, such as the same polymer as the porous polymer foam. In yet another embodiment, both the contact layer of the heat exchange region and the second layer of the heat exchange region can independently comprise a metal. Suitable metals include, but are not limited to, gold, silver, palladium, platinum, copper, stainless steel, and aluminum. In certain embodiments, the metal is copper, stainless steel, or aluminum.

Such composite structures can be prepared by, for example, coating a surface of a polymeric substrate with a metal according to methods familiar to those skilled in the art (e.g., by evaporation) and subjecting the metal coated polymer substrate to the HIFU process described above. Alternatively, a porous polymer substrate as described above could be prepared and the substrate coated with a metal on one or more surface. In another method, a porous polymeric foam could be prepared and coated on at least one side by a metal.

When the heat transfer elements are used for cooling a surface, the one or more inlets and the one or more outlets can, further, be in thermal and/or fluid communication with a heat radiator. In certain embodiments, the inlets and the outlets are in thermal and fluid communication with a heat radiator. Any heat radiator can be used which is suitable for the intended purpose. Suitable heat radiators include, but are not limited to, metal blocks or plates (e.g., aluminum or copper), fans, Peltier devices, or a microporous heat radiator (i.e., a porous polymeric foam configured for cooling). In another example, when the first element is a microprocessor in a laptop computer, the heat radiator can be a porous polymeric foam located behind the display to allow radiation of heat from the fluid.

When the heat transfer elements are used for heating a surface, the one or more inlets and the one or more outlets can, further, be in thermal and/or fluid communication with a heat source. In certain embodiments, the inlets and the outlets are in thermal and fluid communication with a heat source. Any heat source can be used which is suitable for the intended purpose. Suitable heat sources include, but are not limited to, resistively heated metal blocks (e.g., copper), Peltier devices, or a microporous heat radiator (i.e., a porous polymeric foam configured for heating). In another example, the first element can be subflooring and the heated water can be circulated from a hot water heater through the porous polymeric foam.

The heat exchange region can be disposed in any orientation suitable for the intended purpose. For example, the region can comprise one or more channels, each containing the porous polymeric foam. In certain embodiments, the channels are a microfluidic channels. The term "microfluidic"

as used herein means the referenced item has at least one dimension that is less than about 1000 µm, or less than about 500 µm, or less than 200 µm, or less than 100 µm. For example, a microfluidic region can be a microfluidic channel having any length suitable for the intended purpose, but a diameter of less than about 1000 µm, or less than about 500 µm, or less than 200 µm, or less than 100 µm. Each of the channels can have any shape suitable for providing a suitable surface area for efficient heat transfer. For example, the channels can be straight, circular, spiral, zig-zag, serpentine, and the like.

Overall, the heat exchange regions each can have a thickness suitable for the intended purpose. However, in certain embodiments, the contact layer of the heat exchange regions can have a thickness between about 1 µm and about 50 µm to encourage efficient heat transfer to and from the heat exchange fluid. In certain other embodiments, the contact layer of the heat exchange regions has a thickness between about 1 µm and about 40 µm; or about 1 µm and about 30 µm; or about 1 µm and about 20 µm; or about 1 µm and about 10 µm; or about 1 µm and about 5 µm.

The second layer of the heat exchange regions can have any thickness required for the intended purpose of the device. In certain embodiments, the second layer of the heat exchange region can have a thickness between about 10 µm and about 5 mm. In certain embodiments, the second layer of the heat exchange regions can have a thickness between about 10 µm and about 1000 µm; or about 10 µm and about 500 µm; or about 10 µm and about 250 µm; or about 10 µm and about 100 µm; or about 1 mm and about 5 mm. However, in certain other embodiments where a heat exchange region is disposed between first and second elements each having a surface in need of heating or cooling, the second layer of the heat exchange regions can have a thickness between about 1 µm and about 50 µm to encourage efficient heat transfer to and from the heat exchange fluid. In certain other embodiments, the second layer of the heat exchange regions has a thickness between about 1 µm and about 40 µm; or about 1 µm and about 30 µm; or about 1 µm and about 20 µm; or about 1 µm and about 10 µm; or about 1 µm and about 5 µm.

In another aspect, methods are provided for heating or cooling a surface of a device in need of such heating or cooling, comprising providing a device according to any of the preceding embodiments and circulating a heat exchange fluid through the heat transfer element via the one or more inlets and the one or more outlets.

Suitable heat exchange fluids include, but are not limited to, water, deionized water, ethylene glycol, propylene glycol, dielectric fluid, perfluorinated carbons such as 3M's dielectric fluid Fluorinert™, polyalphaolefin (PAO), liquid nitrogen, and liquid helium, The heat exchange fluid may be circulated through the one or more heat exchange regions to the heat radiator either passively, or by providing a fluid pump in fluid communication with the one or more inlets and the one or more outlets.

In another aspect, methods are provided for preparing a device according to any of the preceding embodiments, comprising operatively attaching, to at least one surface of a first element in need of heating or cooling, at least one heat exchange element as described according to any of the preceding embodiments or combinations thereof, of any aspect of the invention.

For example when a porous structure is created in a thin sheet or flexible film, it can be conformed to any shape by either pressing onto or thermoforming it to the device that must be cooled. The polymer structure could also be sandwiched between electrical devices such as dual core processors. In such an arrangement, both the contact layer of one or more heat exchange regions and the second layer of the one or more heat exchange regions should both be thin (i.e., between about 1 µm and 50 µm in thickness). Inlet and outlet ports can be created anywhere on the porous sheet or film material to transfer coolant to and from the porous structure.

In another aspect, the invention provides heat transfer elements comprising at least one heat exchange region, each having a distal end and a proximal end, wherein each heat exchange region independently comprises (i) a porous polymeric foam disposed between a contact surface of the heat transfer region and a second surface of the heat transfer region;

(ii) one or more inlets at or near the proximal end of the heat exchange region, wherein each inlet is in fluid communication with the porous polymeric foam; and (iii) one or more outlets at or near the distal end of the heat exchange region, wherein each outlet is in fluid communication with the porous polymeric foam, wherein the contact surface of each heat transfer region and the second surface of each heat transfer region each independently comprise an essentially liquid impermeable material.

Embodiments of the number of heat exchange regions, porous polymeric foam, locations of inlets and outlets, the contact and second surfaces and essentially liquid impermeable material are as described for the preceding aspects and embodiments of the invention.

All embodiments of any aspect of the present invention can be combined with any other embodiment of the same or different aspect of the invention, unless the context clearly dictates otherwise.

EXAMPLES

Example 1

FIG. 1 shows a diagrammatical illustration of a system using porous or microporous materials for cooling. Devices 100 and 101 that need to be cooled, such as central processing units, are overlaid with a material that includes interconnected porous structures 305 and 306. A pump 102 pumps a heat transfer fluid 103 into the inlet. From the inlet, the heat transfer fluid passes into the interconnected porous structure 305. The porous structure 305 can be provided in a back-and-forth configuration to cover greater surface area. As mentioned above, the porous structure 305 can be created through a HIFU process that can provide a narrow strip of foam to create such back-and-forth configuration or a solid-state foaming process followed by ultrasound cavitation to create an interconnected porous structure. The porous structure 305 can also include a composite wherein the interconnected porous structure is overlaid or sandwiched with a fluid barrier material. From the porous structure 305, the heat transfer fluid, after having absorbed heat, is passed through the outlet and can enter a second porous structure 306 of a second device 101. Any number of porous structures can be daisy chained in a serial configuration to cool more than one device or, alternatively, from the pump 102, the heat transfer fluid 103 can be passed into each porous structure in a parallel configuration. After passing through the heat-producing devices 100 and 101, the heat transfer fluid 105 is passed into a heat exchanger 106 (106 can also be a microporous heat exchanger of the same design as the heat radiator but configured to dissipate the heat; such a microporous heat exchanger would typically be of a larger size), wherein the heat absorbed by the heat transfer fluid is released to the air, such as in a fan-cooled radiator, or to another liquid. From the heat exchanger 106, the cooled heat transfer fluid returns to the pump 102 to maintain the heat removal process in a continuous mode.

FIG. 2 is a diagrammatical illustration of an enlarged cross-sectional area to show a porous structure 305 of FIG. 1. The porous structure shown in FIG. 2 includes an area of interconnected pores 202. The interconnected porous center 202 is encased within a lower (contact layer) 201 and an upper 200 (second layer) liquid barrier material to prevent the heat transfer fluid from escaping to the surrounding environment.

Example 2

Figure 4:
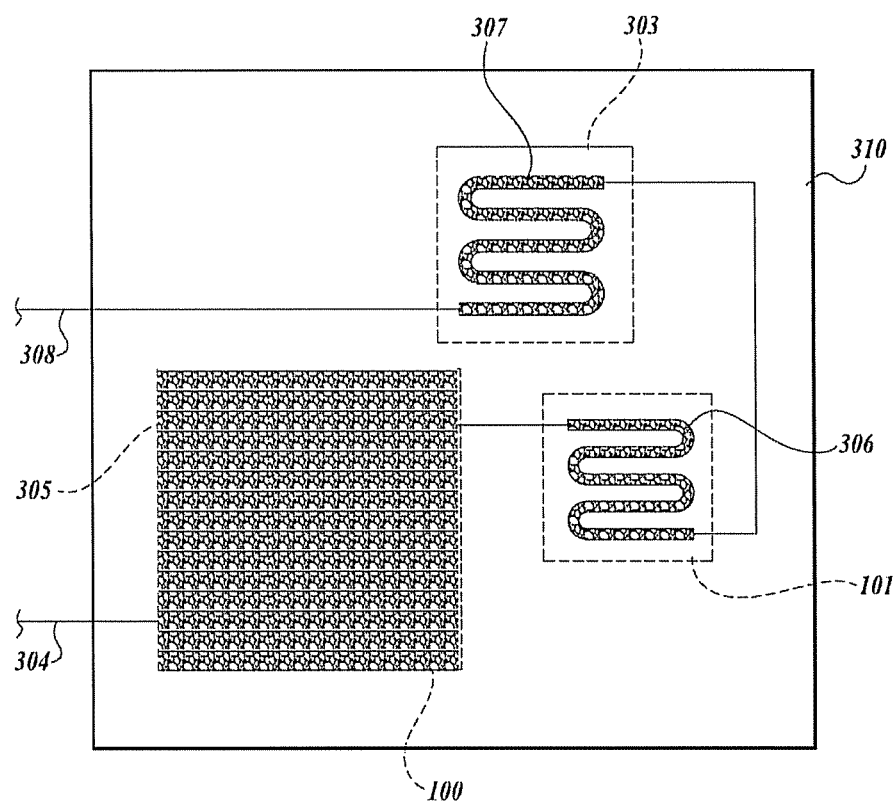
FIG. 4 is a diagrammatical illustration of a top view of another exemplary embodiment of devices needing to be cooled arranged in a serial configuration

FIGS. 3 and 4 are diagrammatical illustrations of a top view of the devices needing to be cooled arranged in a serial configuration. Three devices in need of cooling, 100, 101, and 303 are illustrated in each figure. Heat transfer fluid 304 enters an interconnected porous structure 305 on top of the device 100. After exiting the porous structure 305, the heat transfer fluid passes to a second porous structure 306 on top of a second device 101 in a back-and-forth configuration to cover as much area as possible. Alternatively, as illustrated in FIG. 4, instead of a back-and-forth configuration the porous region could uniformly cover the entire surface (305) of the microprocessor. After exiting the porous structure 306, the heat transfer fluid passes into the entrance of a third porous structure 307 over a third heat-generating device 303, similarly in a back-and-forth pattern to cover as much area as possible. From the interconnected porous structure 307, the heat transfer fluid exits through line 308 to enter a heat exchanger for removal of the heat from the heat transfer fluid. In an alternate embodiment, the three devices 100, 101, and 303 can receive heat transfer fluid in a parallel arrangement so that the temperature of the heat transfer fluid will be the same as it enters the interconnected porous structure overlying each heat-producing device. The area of the interconnected porous structure overlying any of the heat-generating devices can be increased according to the expected amount of heat generated by the device and the estimated temperature at which the heat transfer fluid is being pumped through the interconnected porous structure.

The interconnected porous structures 305, 306, and 307 can be fabricated within a single sheet 310, forming a single heat exchange element having three heat exchange regions, or alternatively, can be independent sheets containing only a single porous structure, forming three separate heat exchange elements, each having a single heat exchange region. Furthermore, the larger sheet 310 can be flexible so as to allow the sheet 310 to conform over the heat-generating devices 100, 101, and 303. Alternatively, the sheet 310 can be heated and then pressed onto the heat-generating devices so as to conform to the topography of the circuit boards onto which the sheet 310 is applied.

Example 3

Figure 5:
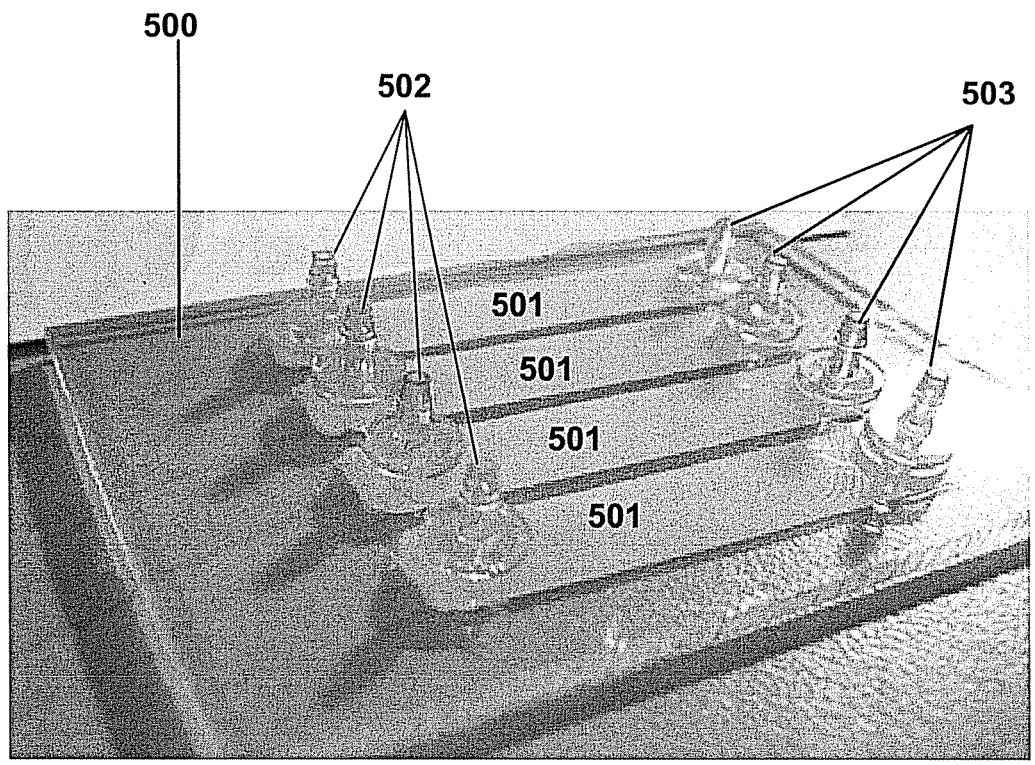
FIG. 5 is a photograph of a heat transfer element wherein porous polymeric foam and the essentially water impermeable materials are each formed from PMMA according to the methods as described in Example 3.
Figure 6:
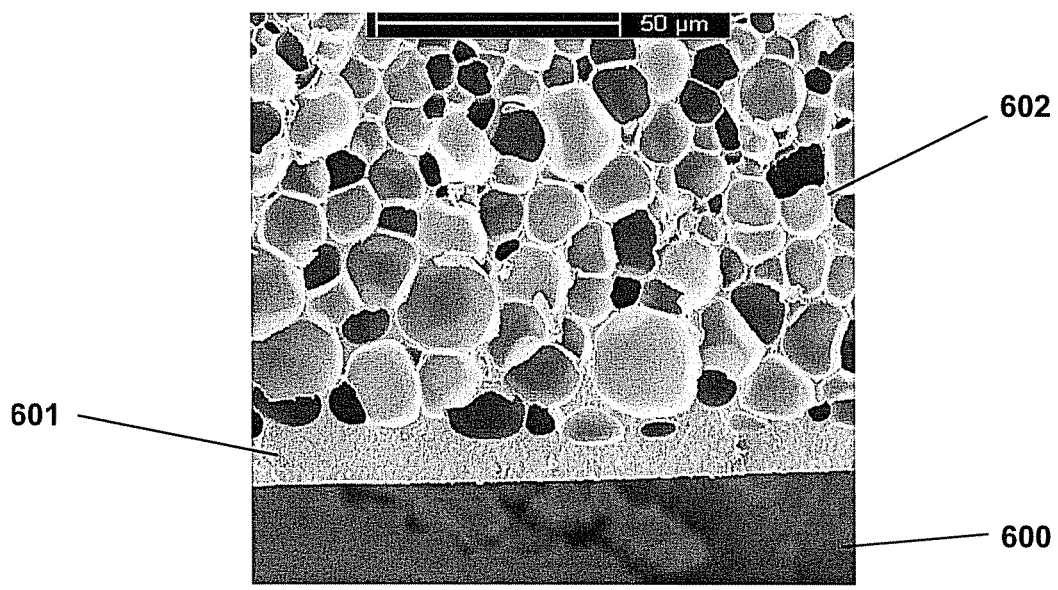
FIG. 6 is a SEM showing a vertical slice through an exemplary device according to the present disclosure.
Figure 7:
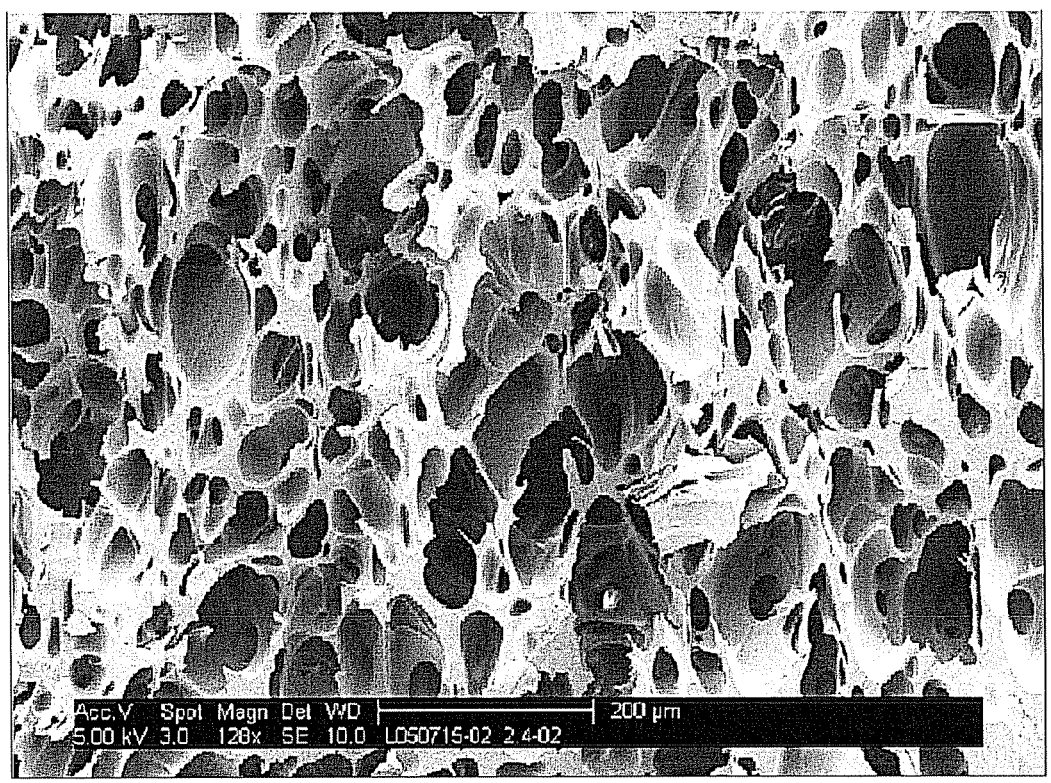
FIG. 7 is SEM showing the open-celled porous structure of a porous polymeric foam as used in the present disclosure.

FIG. 5 is a picture of a prototyped polymer heat sink. FIGS. 6 and 7 illustrate a SEM vertical slice through of the porous regions 501 of the prototyped heat sink in FIG. 5. The prototype heat sink in FIG. 5 was constructed by first obtaining a solid PMMA polymer sheet 500 with dimensions of 7.5 cm×5 cm of 3 mm thickness. The polymer sample was first placed in a pressure vessel with high pressure $CO_2$ gas for enough time for the polymer to absorb sufficient gas for foaming. The sample was then removed from the pressure vessel and exposed to ultrasound energy to expand the polymer and create the internal interconnected porous structures 501 (602, FIG. 6). This process also leaves a solid layer of polymer on the surface called the heat transfer region. This expansion foaming method is detailed in U.S. Patent Application Publication No. 2008/0094937, though could also be produced by other methods by those skilled in the art.

To access the internal porous structure 501, inlet and outlet holes were drilled at the locations 502 and 503 through the heat transfer layer 601 and partially into the porous region 602. Inlet and outlet barbed tube connectors 502 and 503 were purchased and adhesively bonded to the heat sink polymer substrate with epoxy. After the epoxy was cured the polymer heat sink was placed upon a microprocessor. Fluid inlet hoses coming from the fluid pump were attached to 502 and fluid outlet hoses were placed on the connectors 503 where the outlet hoses then traveled to a heat exchanger.

FIG. 6 illustrates a SEM of a vertical slice through a device according to the present invention, such as the example show in FIG. 5, focusing on the interface between the heat exchange region and the surface of the device in need of heating or cooling. In particular, FIG. 6 shows the porous polymeric foam 602, the contact layer 601 comprising the essentially liquid impermeable material, and a device having a surface in need of cooling 600. FIG. 7 is a second SEM image showing the open-celled nature of the porous polymeric foam used in the examples and the aspects and embodiments described above.

While the preferred embodiment of the invention has been illustrated and described, it will be appreciated that various changes can be made therein without departing from the spirit and scope of the invention.

I claim:

1. A device comprising a first element having at least one surface in need of heating or cooling and at least one heat transfer element in thermal communication with each surface in need of heating or cooling, wherein each heat transfer element comprises at least one heat exchange region, each having a distal end and a proximal end, wherein each heat exchange region independently comprises (i) a porous polymeric foam disposed between a contact surface of the heat transfer region and a second surface of the heat transfer region;

(ii) one or more inlets at or near the proximal end of the heat exchange region, wherein each inlet is in fluid communication with the porous polymeric foam; and (iii) one or more outlets at or near the distal end of the heat exchange region, wherein each outlet is in fluid communication with the porous polymeric foam, wherein the contact surface of each heat transfer region and the second surface of each heat transfer region each independently comprise an essentially liquid impermeable material; and at least a portion of the contact surface of each heat transfer region is operatively attached to at least one surface in need of heating or cooling.

2. The device of claim 1, wherein the first element comprises at least two surfaces in need of heating or cooling, and either (i) at least a portion of the contact surface of one or more heat transfer regions of a single heat transfer element is operatively attached to each surface in need of heating or cooling; or (ii) separate heat transfer elements are in thermal communication with each surface in need of heating or cooling, wherein at least a portion of the contact surface of one or more heat transfer regions of each heat transfer elements is operatively attached to its respective surface in need of heating or cooling.

3. The device of claim 1, wherein at least two heat transfer elements are in thermal communication with the at least one surface in need of heating or cooling; and at least a portion of the contact surface of each heat transfer region is operatively attached to at least one surface in need of heating or cooling.

4. The device of claim 1, comprising a second element having at least one surface in need of heating or cooling and at least one heat transfer element in thermal communication with at least one surface in need of heating or cooling of the second element, wherein either
  (i) at least a portion of the contact surface of at least one heat transfer region is operatively attached to at least one surface in need of heating or cooling of the second element; or
  (ii) the second surface of at least one heat transfer region, is operatively attached to at least one surface in need of heating or cooling of the second element.

5. The device of claim 1, wherein each heat transfer element comprises at least two heat exchange regions.

6. The device of claim 1, further comprising at least one heat radiator in thermal and/or fluid communication with each of the inlets and each of the outlets.

7. The device of claim 1, further comprising at least one fluid pump in fluid communication each of the inlets and each of the outlets.

8. The device of claim 1, wherein each essentially liquid impermeable material independently comprises a polymer.

9. The device of claim 8, wherein the porous polymeric foam and the essentially liquid impermeable material each comprise the same polymer.

10. The device of claim 8, wherein the porous polymeric foam and/or essentially liquid impermeable material each independently comprise a polymer composite, wherein the polymer composite comprises (i) a polymer and (ii) thermally conductive particles or fibers.

11. The device of claim 10, wherein the thermally conductive particles or fibers comprise aluminum, copper, diamond, metal coated inorganic nanoparticles, carbon fibers, carbon nanofibers, carbon nanotubes, carbon powder, graphene nanoplatelets, inherently conductive polymers, or inherently dissipative polymers.

12. The device of any claim 10, wherein the polymer is a cyclic olefin polymer, polyethylene, polypropylene, polyetherimide, polytetrafluoroethylene, polyetherketoneketone, polymethylmethacrylate, polyvinylidene chloride, liquid crystal polymer, polychlorotrifluoroethylene, polyethylene terephthalate, poly(ethylene-co-vinyl alcohol), or polyetheretherketone.

13. The device of claim 1, wherein the essentially liquid impermeable layer comprises a metal.

14. The device of claim 13, wherein the metal is copper, stainless steel, or aluminum.

15. The device of claim 13, wherein the porous polymeric foam comprises a cyclic olefin polymer, polyethylene, polypropylene, polyetherimide, polytetrafluoroethylene, polyetherketoneketone, polymethylmethacrylate, polyvinylidene chloride, a liquid crystal polymer, polychlorotrifluoroethylene, polyethylene terephthalate, poly(ethylene-co-vinyl alcohol), or polyetheretherketone.

16. The device of claim 1, wherein each heat exchange region comprises one or more channels, each containing the porous polymeric foam.

17. The device of claim 16, wherein each channel is a microfluidic channel.

18. The device of claim 1, wherein each contact layer of each heat exchange region has a thickness between about 1 µm and about 50 µm.

19. The device of claim 1, wherein the first element and/or second element, when present, is a microprocessor, circuit board, battery, electronic display screen, solid-state memory, hard drive, light emitting diode, projector bulb, solar panel, aircraft wing, vehicle exhaust system, or human tissue.

20. The device of claim 1, wherein the porous polymeric foam comprises pores having an average diameter size of about 10 µm to about 200 µm.

21. The device of claim 1, wherein the porous polymeric foam comprises pores having an average diameter size of about 80 µm to about 300 µm.

* * * * *